（12）United States Patent
Kwong et al.

(10) Patent No.: US 12,512,348 B2
(45) Date of Patent: Dec. 30, 2025

(54) SYSTEM AND PROCESS FOR SORTING DIE FROM WAFER USING ANGLED WAFER TABLE AND ANGLED TURRET

(71) Applicant: MIT SEMICONDUCTOR (TIAN JIN) CO., LTD., Tianjin (CN)

(72) Inventors: Kim Mone Kwong, Singapore (SG); Siong Huat Neo, Singapore (SG); Kok Yeow Lim, Singapore (SG); Zhi Qiang Mao, Singapore (SG)

(73) Assignee: MIT SEMICONDUCTOR (TIAN JIN) CO., LTD., Tianjin (CN)

( * ) Notice: Subject to any disclaimer, the term of this patent is extended or adjusted under 35 U.S.C. 154(b) by 3 days.

(21) Appl. No.: 18/690,121

(22) PCT Filed: Sep. 10, 2021

(86) PCT No.: PCT/SG2021/050552
§ 371 (c)(1),
(2) Date: Mar. 7, 2024

(87) PCT Pub. No.: WO2023/038572
PCT Pub. Date: Mar. 16, 2023

(65) Prior Publication Data
US 2025/0140586 A1    May 1, 2025

(51) Int. Cl.
*H01L 21/67* (2006.01)
*H01L 21/68* (2006.01)
*H01L 21/683* (2006.01)

(52) U.S. Cl.
CPC .. *H01L 21/67271* (2013.01); *H01L 21/67144* (2013.01); *H01L 21/681* (2013.01); *H01L 21/6838* (2013.01)

(58) Field of Classification Search
CPC .............. H01L 21/67271; H01L 21/67144
(Continued)

(56) References Cited

U.S. PATENT DOCUMENTS 5,154,730 A * 10/1992 Hodos ................. C23C 14/568
204/298.25
5,295,777 A * 3/1994 Hodos ............... H01L 21/67751
414/217
(Continued)

FOREIGN PATENT DOCUMENTS

KR           101341399 B1 * 12/2013 ......... H01L 21/6838
KR      10-2017-0018607 A     2/2017
(Continued)

OTHER PUBLICATIONS

Ryu, Beng So, "Appratus For Sorting Electronic Device", Aug. 20, 2013. (US translation of KR-10-20170018607A) (Year: 2013).*
(Continued)

*Primary Examiner* — Terrell H Matthews
(74) *Attorney, Agent, or Firm* — Harness, Dickey & Pierce, P.L.C.

(57) ABSTRACT

A system for sorting a number of dies from a wafer is provided. The system includes a first wafer table for holding a first wafer frame having the plurality of dies, wherein the first wafer table is inclined at a first angle with respect to a horizontal plane; a second wafer table to accept a plurality of dies, wherein the second wafer table is placed parallel to the horizontal plane; and a rotary turret having a plurality of heads to simultaneously pick, retain and place dies, and is positioned between the first wafer table and the second wafer table, wherein the rotary turret is inclined at a second angle with respect to the horizontal plane. Further, a process for sorting a number of dies from the wafer is also provided.

12 Claims, 10 Drawing Sheets

(58) Field of Classification Search
USPC .......................................................... 209/577
See application file for complete search history.

(56) References Cited

U.S. PATENT DOCUMENTS

| | | | |
|---|---|---|---|
| 10,699,923 B2 * | 6/2020 | Neo | ..................... B65G 47/848 |
| 2011/0038694 A1 * | 2/2011 | Khoo | ............... H01L 21/67271 |
| | | | 414/222.01 |
| 2011/0215134 A1 * | 9/2011 | Sim | ......................... H01L 24/83 |
| | | | 228/101 |
| 2014/0328652 A1 * | 11/2014 | Cheng | ............... H01L 21/67132 |
| | | | 414/223.01 |
| 2019/0139795 A1 * | 5/2019 | Neo | ..................... H01L 21/6838 |
| 2025/0140586 A1 * | 5/2025 | Kwong | ............. H01L 21/67271 |

FOREIGN PATENT DOCUMENTS

| | | | | |
|---|---|---|---|---|
| KR | 20170018607 A * | 2/2017 | ....... | H01L 21/67271 |
| KR | 102449536 B1 * | 9/2022 | ............. | H01L 22/12 |
| WO | WO-2009128698 A1 * | 10/2009 | ....... | H01L 21/67271 |
| WO | WO-2017188889 A1 * | 11/2017 | ........... | B65G 47/848 |

OTHER PUBLICATIONS

International Search Report of the International Searching Authority issued in PCT/SG2021/050552, mailed Dec. 13, 2021; ISA/SG.

* cited by examiner

SYSTEM AND PROCESS FOR SORTING DIE FROM WAFER USING ANGLED WAFER TABLE AND ANGLED TURRET

CROSS-REFERENCE TO RELATED APPLICATIONS

This application is a 371 U.S. National Phase of International Application No. PCT/SG2021/050552, filed on Sep. 10, 2021. The entire disclosure of the above application is incorporated herein by reference.

TECHNICAL FIELD

The present disclosure relates generally to a system and process for sorting a die from a wafer and more particularly to a system and process for sorting a die from a wafer using an angled wafer table and an angled turret.

BACKGROUND

In manufacturing of Integrated Circuits (IC), die sorting also referred to as IC chip sorting, is a process used to determine whether a die in a wafer is of good quality or not. In this process, first, the die is picked from one wafer frame and is inspected using an inspection unit. Thereafter, the inspected die is then placed in another wafer frame. Several pickup and place devices have been developed that are used to pick the die for inspection and place the die in another wafer frame after inspection. The current pickup and place devices together with the wafer tables that are used to hold the wafer frames normally reduce the operational space affecting easy maintenance of the entire system.

For wafer sorter, the wafer is picked from one wafer frame and placed on another wafer frame. The wafer frames can be of same or different size. In some cases, optionally, wafer picked from a wafer frame can be placed on to a waffle pack. Normally, the dies are held on a sticky tape on the wafer frame, thus the dies can be placed vertically on the wafer frame; whereas, the wafer frame and the waffle pack can only hold the dies horizontally.

Referring to the FIG. 1A, a prior art system 100 for sorting a die from a wafer frame 116 is disclosed. The system 100 has a turret 102 having a first head 104 and a second head 106 to alternatively and simultaneously pick-up a die from a wafer frame 116 from a first wafer table 114 and then place it in a wafer frame 110 placed on a second wafer table 112. The system 100 further includes an inspection unit 108. The inspection unit 108 inspects the quality of the die and sorts the die as good and bad, based on an inspection program fed into the inspection unit 108. The heads 104 and 106 after inspection place the inspected die in the wafer frame 110 placed on the wafer table 112. When one of the heads, for example, the second head 106 picks the die from the wafer frame 116 from the first wafer table 114, concurrently the first head 104, for example, places the inspected die in the wafer frame 110 placed on the second wafer table 112. The heads 104 and 106 of the turret 102, therefore, rotate at a predetermined angle in same direction such that while rotating the die picked from the first wafer table 114 is placed in the second wafer table 112 until the process of pickup and place continues. It should be noted that in the system 100, the pickup stroke is longer compared to placement stroke. As shown in FIG. 1, the wafer tables 112 and 114 are overlapping to reduce the operational space of the system 100, but makes the maintenance tasks harder, due to less space between each operation elements.

FIG. 1B, illustrates a schematic top view of working of a turret 140 having a number of heads. The turret 140 picks a die from a wafer frame, inspects the picked die using at least one inspection unit (not shown in FIG. 1B) and places a good or passed die on another wafer frame. In an embodiment, the rotary turret 140 has eighteen heads and each head is mounted twenty degree apart on the turret 140. As shown in FIG. 1B, one of the heads 142 is at a pickup point, another head 144 is at a drop-down point and the heads 146 are pointing to at one or more inspection points.

The main disadvantage of this prior art system is that it uses an overlap wafer table to keep turret small. Moreover, the overlap structure may result in overhang design, which may further result in unstable placement of dies. Further, since the two strokes that is, pickup and place strokes and their respective heads operate at different speed and strength, the overall machine speed and productivity is predictably lower than desired.

The U.S. Pat. No. 5,154,730, titled "Semiconductor Wafer Processing Module Having An Inclined Rotating Wafer Handling", contemplates a wafer processing module equipped with an inclined, rotatable wafer handling turret which receives a semiconductor wafer in horizontal disposition at a load/unload position and rotates the wafer at an angle about an inclined axis to locate the wafer in substantially vertical orientation at a vertical processing position across from a wafer processing apparatus. After processing, the wafer handling turret again rotates the wafer about the inclined axis back to the load/unload position. In this prior art, the turret drive wafers in different orientation for load/unload and sputtering. The turret drive do not use a pick/place heads for transferring dies from wafer to wafer.

The US patent application number US 2014/0328652 A1, titled "Transfer Apparatus for Transferring Electronic Devices and Changing Their Orientations" relates to a transfer apparatus for transferring electronic devices from a wafer to a test handler. The transfer apparatus comprises: i) a rotary device rotatable about an axis; and ii) a plurality of holders configured to hold the electronic devices for transfer from the wafer to the test handler. The plurality of holders are coupled to, and extendable from, the rotary device to pick the electronic devices from the wafer. Specifically, the plurality of holders are arranged circumferentially around, and inclined with respect to, the axis of the rotary device, so as to change an orientation of the electronic devices on the wafer to a desired orientation of the electronic devices on the test handler. This prior art apparatus is used for transferring electronic devices from wafer to test handler and used for sorting the die. Using this prior art device, the orientation of wafer is changed from vertical to upward horizontal, that is, the wafer is placed against the gravity.

The U.S. Pat. No. 5,295,777, titled "Wafer Transport Module with Rotatable and Horizontally Extendable Wafer Holder" conveys a wafer between a horizontal wafer handling apparatus and a vertical wafer processing apparatus. The wafer holder receives wafers in horizontal orientation from a robot in the horizontal wafer handler, secures the wafer to a horizontal pedestal, rotates the wafer and pedestal about an inclined axis to vertical orientation, and then horizontally extends the vertically held wafer out of the transport module to a load/unload station of the vertical wafer processor. In this prior art, the module is used for changing the orientation of wafer without pick/place heads for wafer process.

Though the above prior arts disclose the approach of using an angled turret; however, none of the references make use of effective pick-up or drop/place heads to transfer die from one place to other.

SUMMARY

The following summary is provided to facilitate an understanding of some of the innovative features unique to the disclosed embodiment and is not intended to be a full description. A full appreciation of the various aspects of the embodiments disclosed herein can be gained by taking into consideration the entire specification, claims, drawings, and abstract as a whole.

It is, therefore, one aim of the disclosed embodiments to provide for an angled rotary turret, which transfers wafer die from a first wafer table in a non-horizontal orientation (70° to 120° angle relative to the horizontal plane) to a second wafer table (or tray) in a horizontal orientation during die-wafer sorting process or simply die sorting process. Essentially, the present embodiment relates to the transfer of die from a first location (vertical) to a second location (horizontal).

The main objective of the present embodiment is to provide a one-step wafer-die displacement from a non-horizontal position to a horizontal position by using an angularly positioned turret, where the horizontally placed wafer die can be easily collected or processed. Further, as the wafer tables, which are placed to hold the wafer/die for the angled rotary turret to pick and place, are arranged in a non-parallel position, thereby saving operation space and allowing easy maintenance without the wafer tables blocking the access to the turret and device, as compared with conventional arrangements of the wafer tables. In addition, a high running speed is achieved since the longitudinal or latitudinal movements are not necessary for turret to transfer the wafer/die any more.

In an aspect, a system for sorting a number of dies from a wafer is provided. The system includes a first wafer table for holding a first wafer frame having the number of dies, and the first wafer table is inclined at a first angle with respect to a horizontal plane; a second wafer table to accept a number of dies and is placed parallel to the horizontal plane; and a rotary turret having a number of heads to simultaneously pick, retain and place dies, and is positioned between the first wafer table and the second wafer table, and the rotary turret is inclined at a second angle with respect to the horizontal plane. The system further includes an inspection unit placed between the first wafer table and the second wafer table to inspect dies picked by a head of the rotary turret from the first wafer table. The inspection unit either causes the turret head to drop a die in a rejection bin if rejected or causes the turret head to move to the second wafer table to place an inspected die on a second wafer frame.

The turret head includes a longitudinally moveable body having a pusher at the top to push the longitudinally moveable body downwards, and a tip at the bottom to pick, retain and drop the dies from the first wafer table, through inspection unit and at the second wafer table respectively, an air/vacuum inlet passing through the pusher and the longitudinally moveable body causing suction or release of the air at the tip, and a spring to bring the longitudinally moving body up as soon as the pusher is released.

The first wafer table is placed vertically or perpendicular to the horizontal plane. Preferably, the second inclined angle is 45°. More preferably, the first inclined angle ranges from 60° to 120°. More preferably, the second inclined angle ranges from 30° to 60°. The turret is rotated from the first wafer table to the second wafer table and then again to the first wafer table. The tip at the head releases the die in a rejection bin or places the inspected die at the second wafer table by the release of air through the vacuum or air inlet. The tip picks and retains the die by suction or vacuum through the vacuum or air inlet. The system further includes a linear motion guide to guide the longitudinally moveable body in upwards and downwards direction while placing or picking die respectively. The inspection unit is either a vision camera system or an optical laser inspection device or both. The inspection unit is a device that passes a ray of light over a die and inspects the die based on light reflected from the die. The inspection unit inspects two, four or six sides of the die.

In another aspect, a process for sorting a number of dies from a wafer is provided. The process includes positioning a first wafer table holding or retaining a plurality of dies in a first wafer frame at a first inclined angle with respect to a horizontal plane; positioning a second wafer table parallel to the horizontal plane; positioning a rotary turret at a second inclined angle with respect to the horizontal plane; picking of the die by the turret from the first wafer frame retained on the first wafer table; inspecting the die picked by turret by the inspection unit; rejecting a defective die by the inspection unit by causing the turret to drop the defective die in a rejection bin; and placing an inspected die by the turret onto a second wafer frame held or retained on the second wafer table. The turret is positioned between the first wafer table and the second wafer table. The head in the turret picks the die from the first wafer table and place the die after inspection in the first wafer frame of the second wafer table. The inspection unit is placed between the first wafer table and the second wafer table. The method further includes rotating the turret from the first wafer table to the second wafer table and then again to the first wafer table.

Figure 1A:
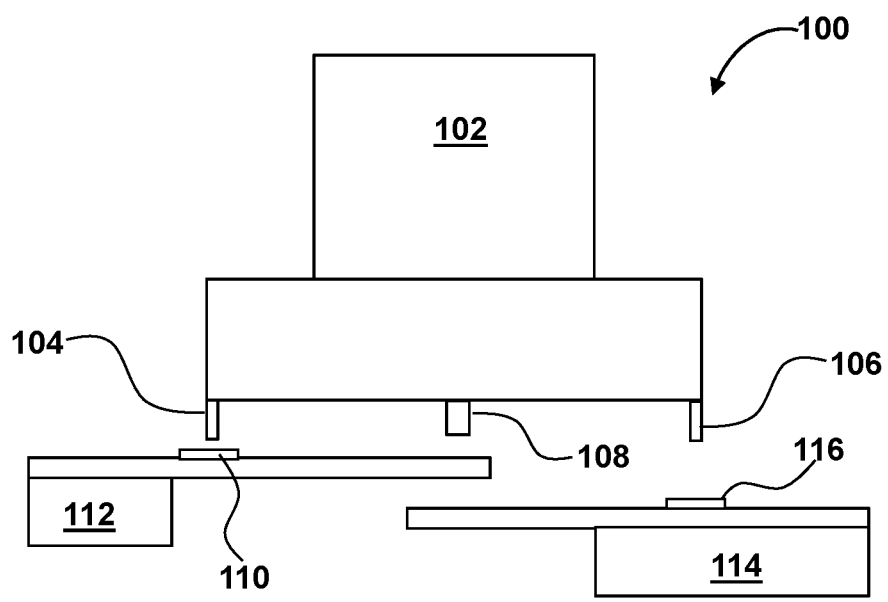
FIG. 1A is a schematic diagram of a prior art system for transferring die from one wafer table to other wafer table.
Figure 1B:
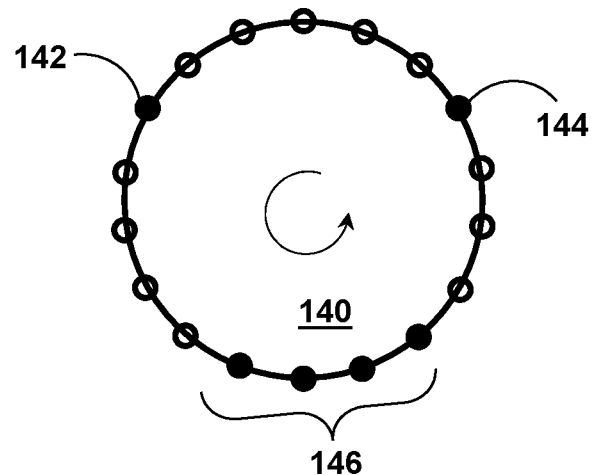
FIG. 1B is a top view of a turret of prior art system of FIG. 1A.

The summary above, as well as the following detailed description of illustrative embodiments, is better understood when read in conjunction with the appended drawings. For the purpose of illustrating the present disclosure, exemplary constructions of the disclosure are shown in the drawings. However, the disclosure is not limited to specific methods and instrumentalities disclosed herein. Moreover, those in the art will understand that the drawings are not to scale. Wherever possible, like elements have been indicated by identical numbers.

DETAILED DESCRIPTION OF ILLUSTRATIVE EMBODIMENTS

The particular configurations discussed in the following description are non-limiting examples that can be varied and are cited merely to illustrate at least one embodiment and are not intended to limit the scope thereof.

The embodiment relates to a one-step wafer die displacement from a non-horizontal position to a horizontal position by using an angularly positioned turret to pickup and place dies from wafer tables arranged non-parallelly with respect to each other and at an angle that may be varied. As the wafer tables placed to hold the wafer/die for the turret to pick and place are arranged in a non-parallel position, operation space is saved and maintenance is easily conducted without the wafer tables blocking the access to the turret and device, as compared with conventional arrangements of the wafer tables. In addition, high running speed is achieved since the longitudinal or latitudinal movements are not necessary for turret to transfer the wafer/die any more. In the description, the phrases or words such as die, wafer die or semiconductor die are used interchangeably.

For the purpose of this application, following definitions may be employed.

The rejected or defective or bad die is a die that has been identified as defective by an inspection unit.

The inspected die refers to a die that has been approved by the inspection unit or not rejected by the inspection unit as defective.

Figure 2:
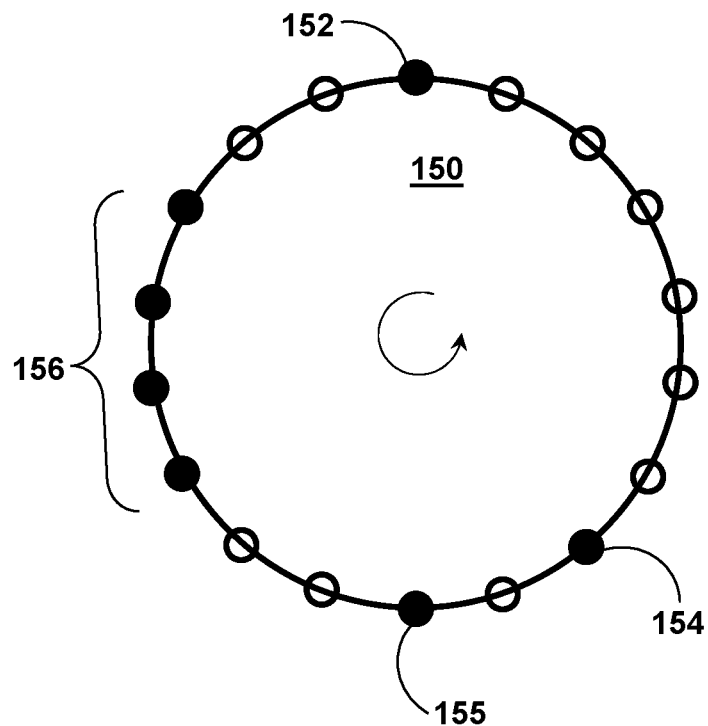
FIG. 2 is a top view of an angled turret of prior art system, according to an embodiment herein.

FIG. 2, illustrates a schematic top view of working of an angled turret 150 having a number of heads, according to an embodiment herein. The angle turret 150 picks a die from a first wafer frame, inspects the picked die using at least one inspection unit (not shown in FIG. 2), drops or rejects a bad or failed die in a rejection bin and while horizontally places a good or passed die on a second wafer frame or tray. In an embodiment, the rotary angled turret 150 has eighteen heads as shown in FIG. 2. Each head is mounted twenty degree apart on the turret 150. It should be noted that the number of heads and its spacing are not limited to eighteen numbers and twenty degrees, other numbers and angles may be designed based on the output and working requirement of a wafer-die sorting system. As shown in FIG. 2, one of the heads 152 is at a pickup point, another head 155 is at a drop-down point, the heads 156 are pointing to at one or more inspection points and the head 154 is at rejection point.

Figure 3:
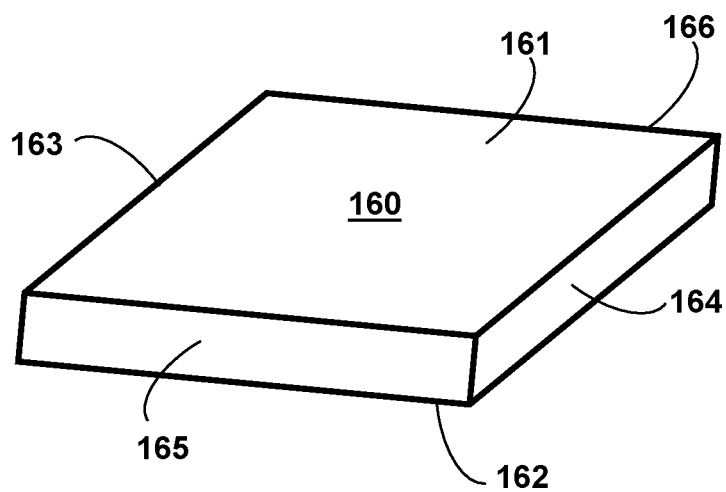
FIG. 3 is a perspective view of a semiconductor die illustrating the sides that are inspected after the semiconductor die is picked from a first wafer frame using the angled turret of FIG. 2, according to an embodiment herein.

The pickup head 152 picks a semiconductor die from the first wafer frame, while the semiconductor dies in heads 156 undergo inspection and the head 155 places the inspected good die on the second wafer frame or the head 154 rejects the bad dies in rejection tray, concurrently or simultaneously. This enhances processing speed of the die sorting process enabling more semiconductor die inspections/rejections at a given time. FIG. 3 illustrates a number of sides or faces 161, 162, 163, 164, 165 and 166 of the semiconductor die 150 that are inspected, by an inspection unit, at heads 156 at the instance shown in FIG. 2.

In an embodiment, the heads 156 perform a number of functions such as vision inspection and/or rejection. Referring to FIG. 3, the inspection unit may inspect two sides, four sides or six sides and after inspection rejects bad or failed dies into a rejection bin.

Figure 4:
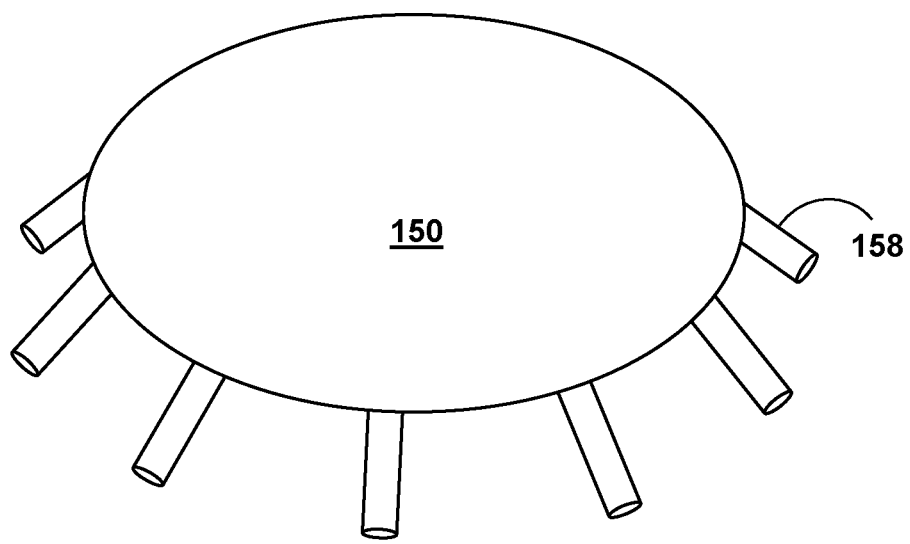
FIG. 4 is a perspective view of the angled turret of FIG. 2, according to an embodiment herein.

FIG. 4 illustrates a perspective view of angled rotary turret 150 having heads 158.

Figure 5:
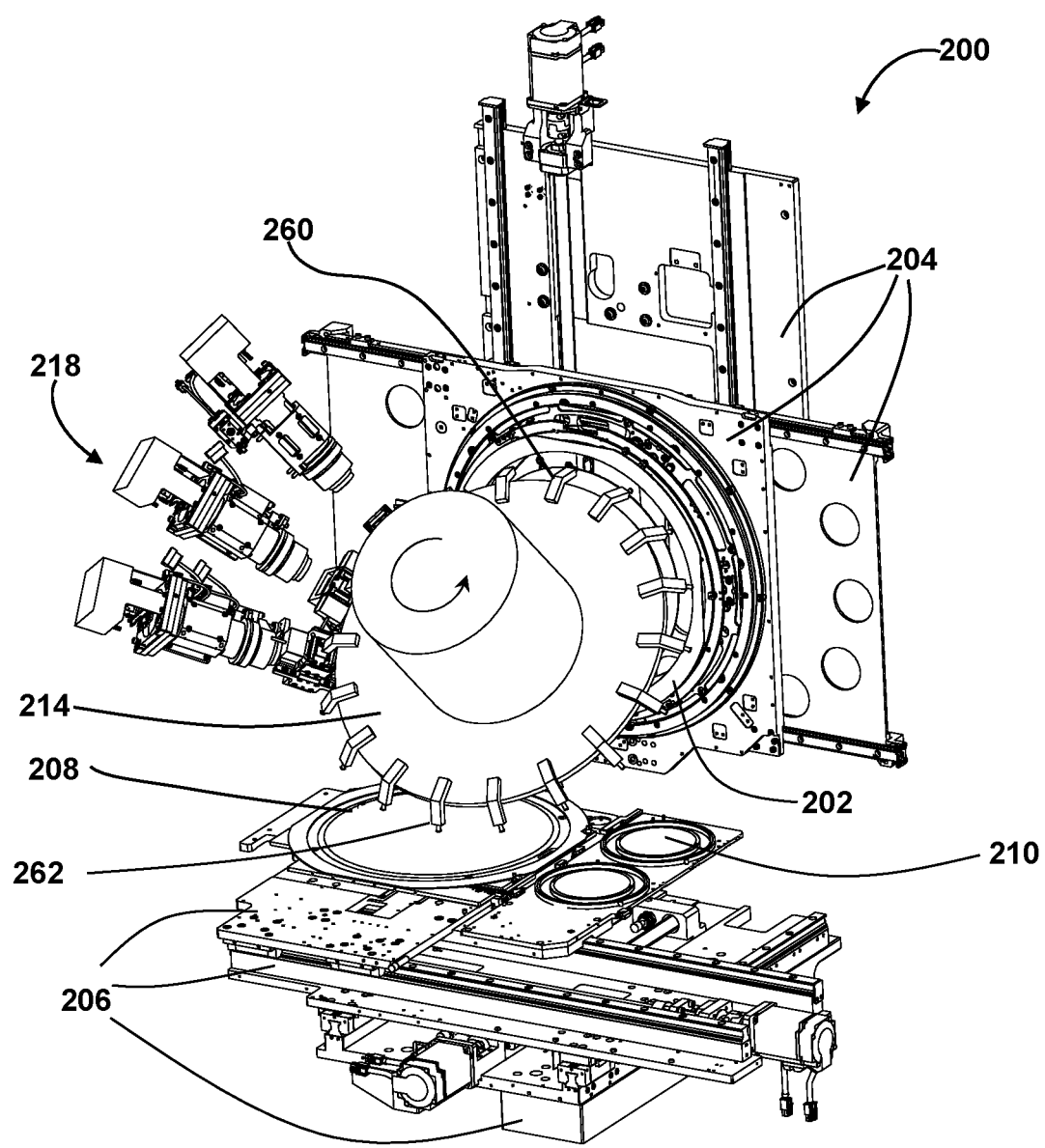
FIG. 5 illustrates a system for transferring and sorting die from one wafer table to other wafer table using an angled turret of FIG. 2, according to an embodiment herein.

FIG. 5 illustrates a system 200 for transferring and sorting die from one wafer table to other wafer table using the rotary angled turret. The system 200 for sorting die from wafer includes a first wafer table 204 (may also be referred to as a pickup table), a second wafer table 206 (may also be referred to as a drop table or placement table), the angled rotary turret 214 and an inspection unit 218. The inspection unit 218 includes a number of inspecting devices for inspecting different parameters. The inspection unit 218 may have one or more inspection software or programs to perform the inspection process. The inspection unit 218, based on the inspection result, labels the die as, a good or a bad die, for further processing of the die in an integrated circuit fabrication process. The first wafer table 204 holds or retains the first wafer frame 202 with a plurality of dies to be inspected and the second wafer table 206 holds or retains the second wafer frame 208. As shown in FIG. 5, the first wafer table 204 is positioned at a first inclined angle with respect to a horizontal plane. The first inclined angle may range from, but not limited, 60 to 120 degrees, with respect to the horizontal plane. The turret 214 has a number of heads arranged around its circumference, as shown in FIG. 5. The two points, for example, a pickup point 260 and a placement point 262 are shown, at which the dies are picked from the first wafer frame 202 placed on the first wafer table 204 and is then placed or dropped on the second wafer frame 208 placed on the second wafer table 206, respectively. The rotation of the turret 214 allows the die to be picked by one of the heads from the pickup point 260 to be carried at the inspection unit 218 for inspection and then, if not rejected, the dies are placed on the second wafer table 206 at the placement point 262. In case if the dies are rejected by the inspection unit 218, the dies can be dropped or placed on the rejection unit 210, for example, bins, tray, waffle pack or hood ring. The inspection unit 218 includes but not limited to a vision camera system or an optical laser inspection device. In an embodiment, an inspection device of the inspection unit 218 passes a ray of light over the die and inspects the quality of the die based on the light reflected from the die.

In one embodiment of the invention, the die is picked from first wafer frame, for example, the frame with sticky tape to hold dies. In another embodiment of the invention, the die can be placed on to the second wafer frame or alternatively, the die can be placed on to a tray, a waffle pack or a hood ring. In one another embodiment of the invention, the die can be rejected after inspection, on to the tray or the waffle pack or the hood ring.

Figure 6:
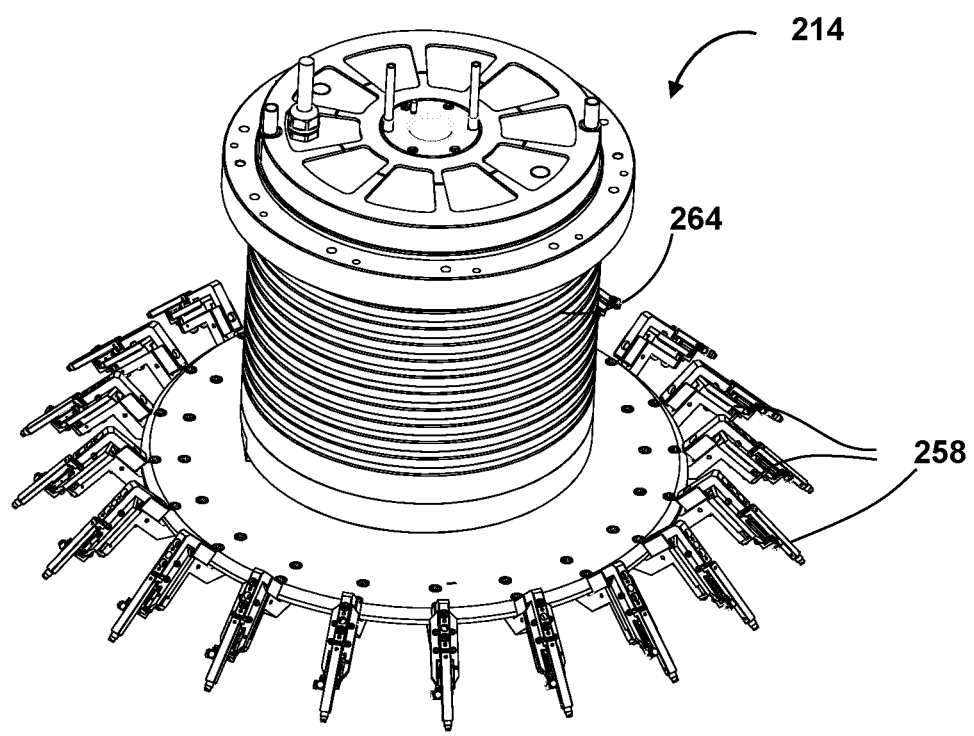
FIG. 6 illustrates a perspective view of the turret as depicted in FIG. 5, according to an embodiment herein.

FIG. 6 illustrates a perspective view of the turret 214 showing the pick and place heads 258, according to an embodiment herein. In order to show the pickup and place heads 258 on the turret 214, a vertically positioned turret is shown in FIG. 6. The turret 214 is placed at an inclined angle. A motor 264 is used for rotating the turret 214 in a clockwise or anticlockwise direction, such that the heads 258 pick the dies from the pickup point 260 and place the dies after inspection at the placement point 262. The rotary turret 214 simultaneously picks, retains and places the dies according to the position of the heads 258. For example, the rotary turret 214 simultaneously picks the die for the first wafer table using one of the heads, while simultaneously retaining a plurality of dies through the inspection unit, and placing an inspected die at the second wafer table.

Figure 7A:
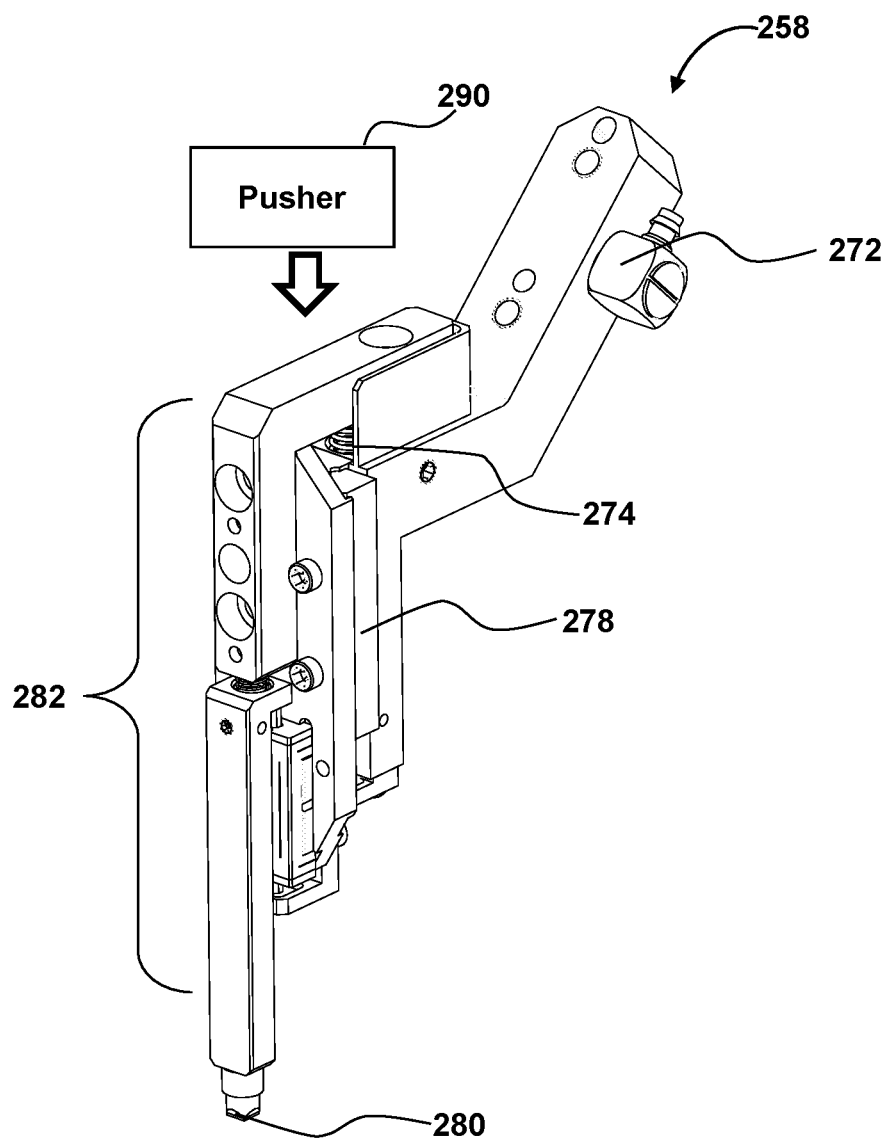
FIG. 7A illustrates a perspective view of a pick and place head as depicted in FIG. 6, according to an embodiment herein.

FIG. 7A illustrates a perspective view of the pick and place head 258 of FIG. 6, according to an embodiment herein. The pick and place head 258 includes a pusher 290, a spring 274, a vacuum or air inlet 272, a spring 274, a picking/dropping tip 280 and a longitudinally moveable body 282. The pusher 290 is placed on and is connected at the top of the body 282 while tip 280 is placed at the bottom of the body 282. The pusher 290 is, apply downward force on the body 282 that pushes the tip 280 downwards, such as, when the head 258 is placed over the die to be picked. The pusher 290 also enables the tip 280 to place the inspected die on the second wafer frame 208 as placed or retained on the second wafer table 206 after inspection. The vacuum or air inlet 272 passes through the pusher 290 and the body 282 and supplies a suction or releasing force at the tip 280. The suction force is applied to pick the die from the first wafer frame 202 of the first wafer table 204. The die is retained at the tip 280 throughout movement of the turret 214 along the inspection unit 218 using vacuum or suction force supplied via vacuum or air inlet 272. After inspection by the inspection unit 218, the good dies are placed on the second wafer frame 208 of the second wafer table 206, by releasing air through the tip 280 from the vacuum or air inlet 272. Once the downward force on the body 282 is released by the pusher 290, a spring 274 brings the body 282 up, after pickup or after placing the die on any of the second wafer frame 208. A replaceable rubber or other suitable material may be used as a pickup tip to hold semiconductor die or strip. In an embodiment, different semiconductor dies may require different rubber tips. In an embodiment, the head 258 further includes at least one linear motion guide 278 to guide the body 282 in upwards and downwards direction, at the time of picking and placing of the die.

Figure 7B:
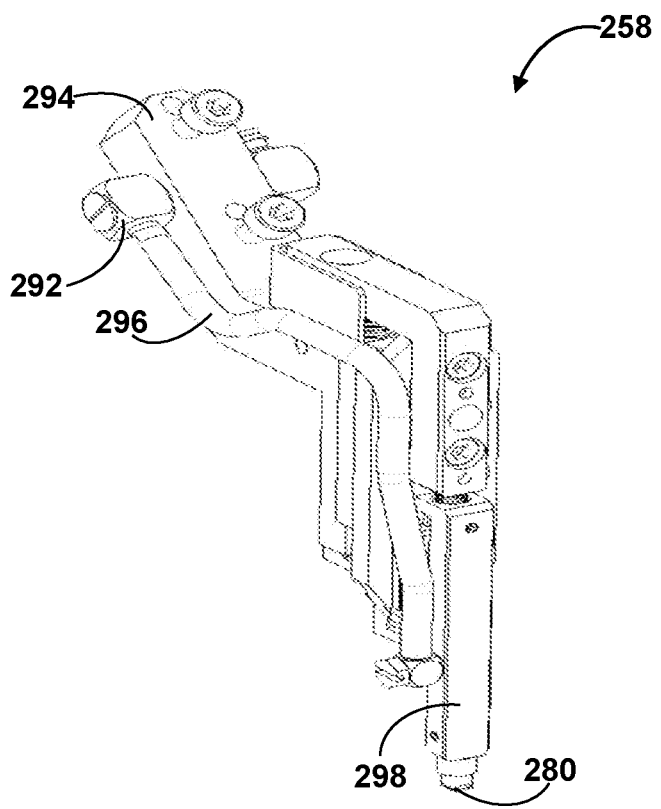
FIG. 7B illustrates a perspective view of a pick and place head as depicted in FIG. 6 with air flow elements, according to an embodiment herein.

FIG. 7B illustrates a perspective view of a pick and place head as depicted in FIG. 6 with air flow elements. The pick and place head 258 as in FIG. 7B shows the air flow, via a conductor 292 attached to a slide bracket 294, a pneumatic tubing 296 and via a sliding arm 298. The air flow via the conductor 292, the slide bracket 294, the pneumatic tubing 296 and the sliding arm 298 and thus allows the tip 280 to place or pick the die in/from the second wafer frame 208 or the first wafer frame 202.

Figure 8:
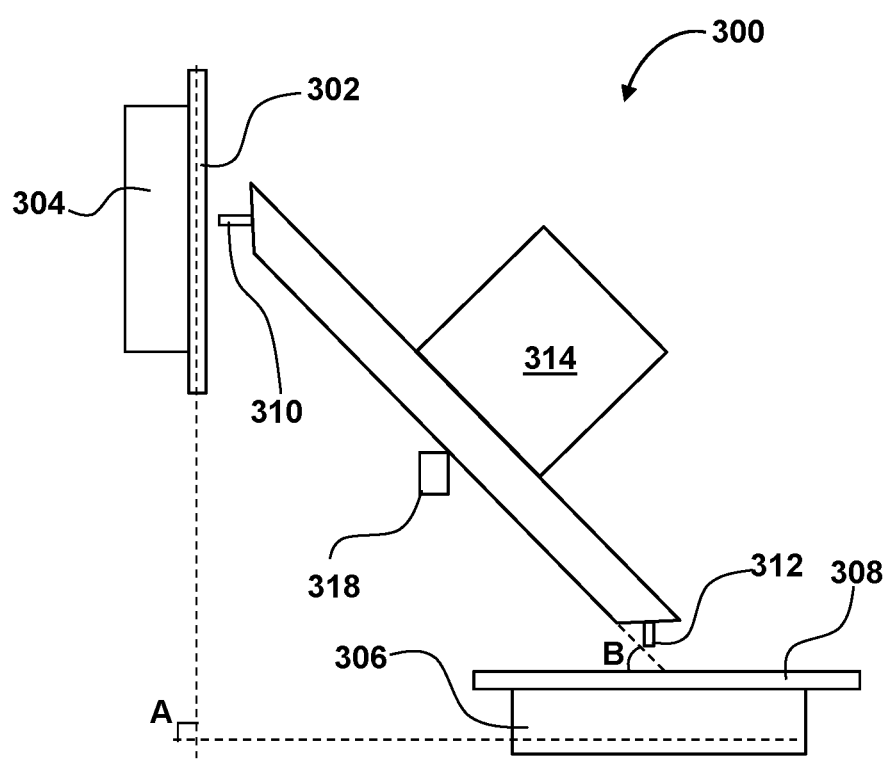
FIG. 8 illustrates a schematic diagram of an example system for transferring and sorting die from one wafer table to other wafer table using an angled turret according to an embodiment herein.
Figure 9:
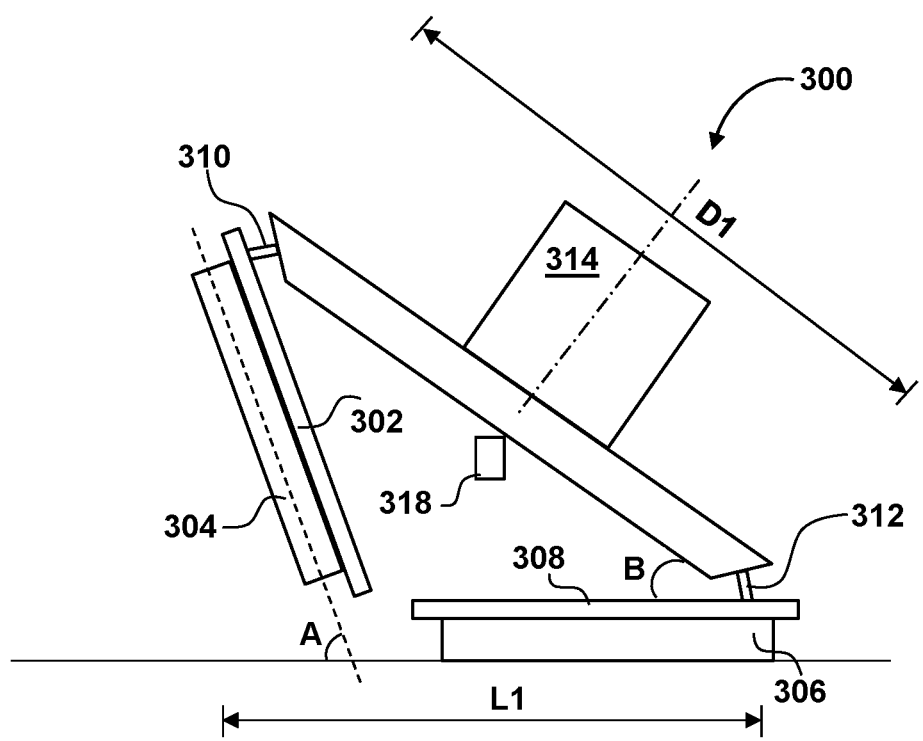
FIG. 9 is a schematic diagram of an another example system for transferring and sorting die from one wafer table to other wafer table using an angled turret, according to an embodiment herein.
Figure 10:
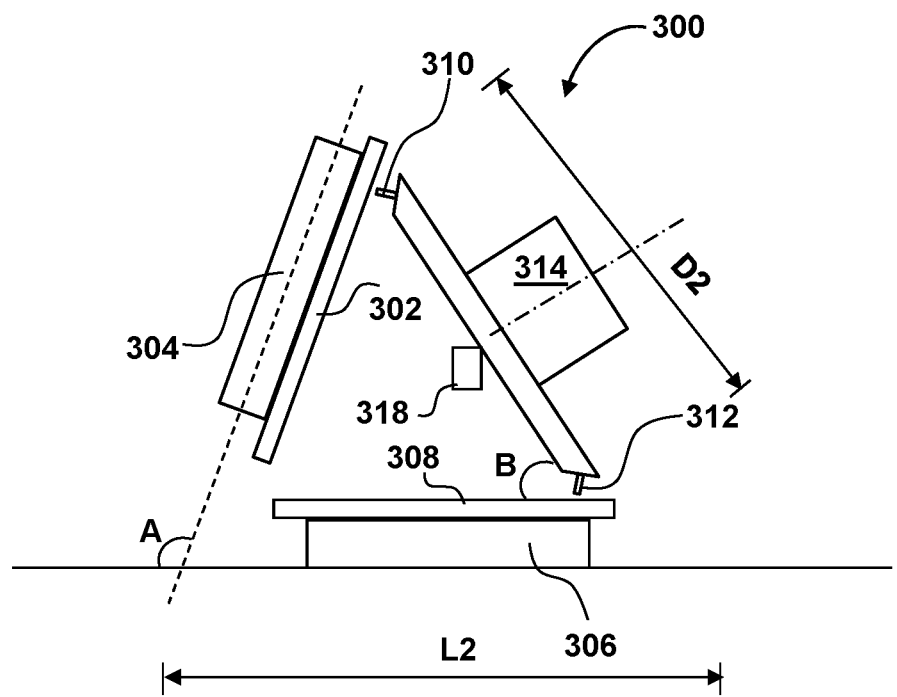
FIG. 10 is a schematic diagram of another example system for transferring and sorting die from one wafer table to other wafer table using an angled turret, according to an embodiment herein.

FIG. 8, FIG. 9 and FIG. 10 shows the various angles in which the angled turret 314 may be arranged with respect to the pickup and placement tables. In FIG. 8, FIG. 9 and FIG. 10 shows only two heads 310 and 312 of the rotary angled turret 314 with one shown at a pickup point and another at the placement point. As explained before, the angled turret 314 may have any number of heads, for example, as shown in FIG. 4, FIG. 5 or FIG. 6, based on required processing speed and other processes involved in the semiconductor fabrication.

FIG. 8 illustrates an example system 300 for die sorting and transferring system according to an embodiment herein in which the first wafer table 304 is positioned perpendicular to a horizontal plane whereas the turret 314 is placed at an angle of 45° with respect to the horizontal plane.

As shown in FIG. 8, the second wafer table 306 is positioned parallel to the horizontal plane and a second wafer frame 308 is placed on it to receive the good die from the turret head, for example, head 312 of the turret 314 after inspection. The placing of the strip/die in the second wafer table 306 is, therefore, performed in a vertically downward direction, along the gravity and hence the inspected die may be easily placed on the second wafer frame 308. It should be noted that, at the time when the head 310 picks a die from a first wafer frame 302 of the wafer table 304 for inspection, the head 312 places the inspected die in the second wafer frame 308 retained on the second wafer table 306. The second wafer frame 308 has one or more space to accept the inspected die from the turret head. Once the die is paced in the second wafer frame 308 of the second wafer table 306, the head 312 rotates at a predetermined degree to pick a new die at pickup point, for inspection and the process continues. The inspection of the die takes place at the inspection unit 318, which lies in between the wafer tables 304 and 306.

In an embodiment, the angle (B) of inclination of the turret with respect to the horizontal plane ranges from 30 to 60 degrees.

Referring to FIG. 9 another exemplary system 300 for sorting and transferring die is provided. The example system 300 of FIG. 9, the first wafer table 304 is inclined at an angle (A) of 70° with respect to the horizontal plane and the turret is inclined at the angle (B) of 30° with respect to the horizontal plane. In a preferred embodiment, the angle of inclination of turret is less than 45°. In such an orientation, when turret angle is less than 45°, the pickup table is inclined away from the drop/placement table, hence eliminating the risk of the die from the pickup table dropping on to the placement/drop table. The main disadvantage when the turret angle (B) is less than 45 degree is that this makes the turret length (D1) longer, which may result in loss of accuracy in placing the die. The heavier turret may also reduce motor speed. However, depending on preferences of output, the turret angle may be customized.

Referring to FIG. 10 another exemplary system 300 for sorting and transferring die is provided. In this embodiment, in this example system 300, the wafer table 304 is placed at the angle (A) of 120° with respect to the horizontal plane and the turret 314 is inclined at the angle (B) of 60° with respect to the horizontal plane. In a preferred embodiment, the turret angle (B) is greater than 450. The main advantage when turret angle (B) is greater than 45 degree is that input table is inclined towards the output table, making the length (D3) of the turret shorter and hence a better placement accuracy, higher motor speed and smaller footprint may be achieved. The main disadvantage when turret angle (B) is greater than 45 degree is that the head may need additional cover to prevent die from dropping onto the output or placement table.

It should be noted that the first inclined angle (A) refers to the angle formed between the first wafer table 304 with the horizontal plane and the second inclined angle (B) refers to the angle formed between the turret 314 with the horizontal plane, as shown in FIG. 9, FIG. 9 and FIG. 10.

Figure 11:
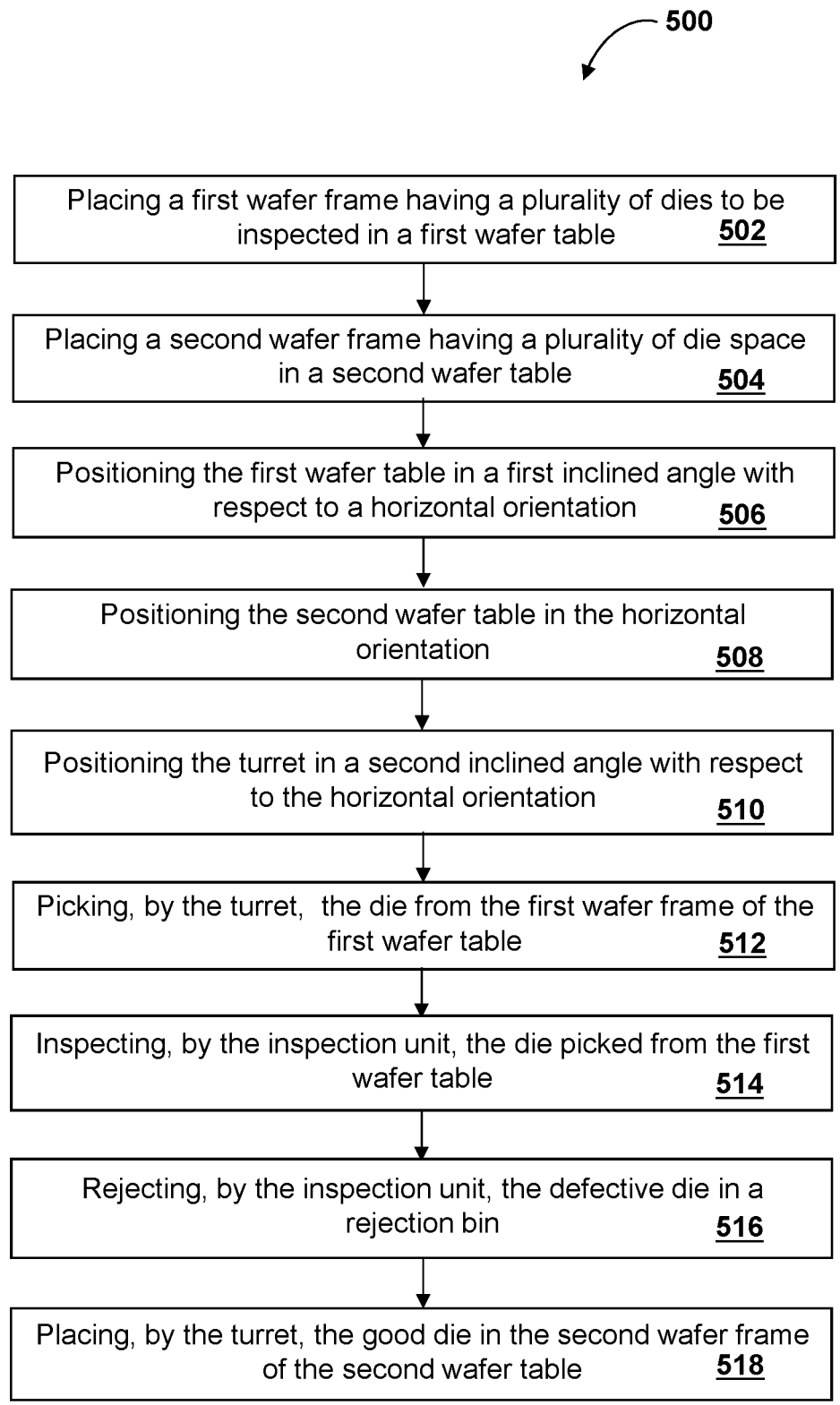
FIG. 11 illustrates a flow chart of an example process sorting, inspecting and a die from one wafer table to other wafer table using an angled turret, according to an embodiment herein.

FIG. 11 illustrates a flow chart of an example process sorting, inspecting and a die from one wafer table to other wafer table using an angled turret, according to an embodiment herein. The process 500 includes placing 502 a first wafer frame having a plurality of dies to be inspected on a first wafer table, placing 504 the second wafer frame to receive an inspected die on a second wafer table. Thereafter, at step 506, the first wafer table is positioned at a first inclined angle with respect to a horizontal plane followed by placing 508 the table parallel to horizontal plane. After the tables are positioned, at step 510, the rotary turret is positioned, between the two tables, in a second inclined angle with respect to the horizontal plane. After the respective positioning of the tables and the turret is achieved in preceding steps, at step 512, the turret picks a die from the first wafer frame of the first wafer table, which is then taken to the inspection unit in step 514 by rotary motion of the turret. At step 516, the inspection unit may either rejects a defective die by causing it to be dropped in a rejection bin by turret or accept a good die by retaining it at a tip of the turret head. The turret then place the good die as inspected by the inspection unit in the second wafer frame in the second wafer table, at step 518. The die picked from the first wafer table rotates until predetermined angle and places the inspected die in the second wafer table. After placing the inspected die in the second wafer table, the turret rotates until another predetermined angle to pick a new die for the inspection. The inspected die is placed in the second wafer frame from top in horizontal wafer table.

The turret is positioned between the first wafer table and the second wafer table in an inclined angle, such that the turret rotates 360 degrees and the heads of the turret comes in contact with the first and second wafer frames during rotation. The turret has a plurality of heads, one used to pick the die from the first wafer table and other to place the die after inspection in the second wafer frame of the second wafer table. When one head picks the die from the first wafer table, at the same time, the other head places the already picked and inspected dies in the second wafer table. In one embodiment, the pick-up of to be inspected die and placing of the inspected die are simultaneously performed in different heads. In another embodiment of the invention, when pick-up is performed at one rotation angle of the turret, the inspected die is placed by the same head after a predetermined degree of rotation.

In an embodiment, the placing position of the die from the head of turret to the second wafer frame of the second wafer table after inspection is perpendicular to the horizontal plane, thus it is placed firmly under gravity allowing easy placement of the die on the second wafer frame. By using the angled turret and aligned wafer table, the present embodiment, therefore, provides the following advantages, provides higher speed (UPH) and small machine sizes, increases the operation space, provides more space for pusher, pick and place camera and provides good accessibility during maintenance period. Further, the stroke for both pick and place is short. In an embodiment, the placement stroke is 2 mm in length whereas the pickup stroke is 2 mm. As would be noted by a person skilled in the art, in conventional methods, the pickup stroke is 23 mm long and the placement stroke is 2 mm long.

It will be appreciated that variations of the above disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

Although embodiments of the current disclosure have been described comprehensively in considerable detail to cover the possible aspects, those skilled in the art would recognize that other versions of the disclosure are also possible.

What is claimed is:

1. A system for sorting a plurality of dies from a wafer comprising:
    a first wafer table for holding a first wafer frame having the plurality of dies, wherein the first wafer table is inclined at a first angle with respect to a horizontal plane;
    a second wafer table to accept the plurality of dies, wherein the second wafer table is placed parallel to the horizontal plane; and
    a rotary turret having a plurality of heads to simultaneously pick, retain and place dies, and is positioned between the first wafer table and the second wafer table, wherein the rotary turret is inclined at a second angle with respect to the horizontal plane and
    several inspection units placed between the first wafer table and the second wafer table to inspect the plurality of dies picked by a head of the rotary turret from the first wafer table, wherein the inspection units either cause the turret head to drop one of the dies in a rejection bin when the die is inspected and rejected, or cause one of the turret heads to move to the second wafer table when the die is inspected and accepted;
    wherein the first wafer table first angle ranges from 60° to 120° and the rotary turret second angle ranges from 30° to 60°.

2. The system of claim 1, wherein the turret head comprises:
    a longitudinally moveable body having a pusher at the top to push the longitudinally moveable body downwards, and a tip at the bottom to pick the dies and to retain the dies from the first wafer table through the inspection unit to the second wafer table,
    an air/vacuum inlet passing through the pusher and the longitudinally moveable body causing suction or release of the air at the tip, and
    a spring to bring the longitudinally moving body up as soon as the pusher is released.

3. The system of claim 1, wherein the first wafer table is positioned perpendicular with respect to the horizontal plane.

4. The system of claim 1, wherein the second angle is 45°.

5. The system of claim 1, wherein the turret is rotated from the first wafer table to the second wafer table and then again to the first wafer table.

6. The system of claim 1, wherein the tip releases the die in the rejection bin or places the inspected die at the second wafer table by release of the air through the vacuum or air inlet.

7. The system of claim 1, wherein the tip picks and retains the die by suction through the vacuum or air inlet.

8. The system of claim 2, further comprises a linear motion guide to guide the longitudinally moveable body in upwards and downwards direction while placing or picking a die respectively.

9. The system of claim 1, wherein the plurality of dies are placed onto a second wafer frame.

10. The system of claim 1, wherein the inspection units for inspecting the dies each comprise one of a vision camera system or an optical laser inspection device.

11. The system of claim 10, wherein each of the inspection units passes a ray of light over a die and inspects the die based on light reflected from the die.

12. The system of claim 10, wherein each of the inspection units inspects two, four or six sides of the die.

* * * * *